United States Patent

Archer

[15] 3,702,025

[45] Nov. 7, 1972

[54] DISCRETIONARY INTERCONNECTION PROCESS

[72] Inventor: Alva I. Archer, Clearwater, Fla.

[73] Assignee: Honeywell Inc., Minneapolis, Minn.

[22] Filed: May 12, 1969

[21] Appl. No.: 823,741

[52] U.S. Cl. ........................29/574, 29/407, 29/577, 29/593, 29/626, 174/68.5, 317/101 CE, 317/101 A, 317/234 D

[51] Int. Cl. ..............................................B01j 17/00

[58] Field of Search........29/407, 593, 574, 625, 626, 29/628; 317/234 D, 101 CE

[56] References Cited

UNITED STATES PATENTS

| | | | |
|---|---|---|---|
| 2,982,002 | 5/1961 | Shockley | 29/574 |
| 3,303,400 | 2/1967 | Allison | 29/625 UX |
| 3,377,513 | 4/1968 | Ashley et al. | 29/574 |
| 3,388,457 | 6/1968 | Totla | 29/574 |
| 3,423,822 | 1/1969 | Davidson et al. | 29/574 |
| 2,848,792 | 8/1958 | Reitz | 29/624 |
| 3,028,659 | 4/1962 | Wen Chow et al. | 29/624 X |
| 3,441,804 | 4/1969 | Klemmer | 317/234 D |
| 3,484,341 | 12/1969 | Devitt | 317/234 D |
| 3,585,712 | 6/1971 | Boncuk | 29/574 |

*Primary Examiner*—John F. Campbell
*Assistant Examiner*—Robert W. Church
*Attorney*—Charles J. Ungemach, Ronald T. Reiling and James F. Phillips

[57] ABSTRACT

A process wherein numerous identical or similar cells are formed into a continuous chain of such cells on a single semiconductor wafer is shown. The cells are cataloged as either good or bad cells and then a layer of dielectric followed by a pattern of conductors is deposited over all of the cells. Connections are discretionarily made to the good cells by omitting to etch holes through the dielectric layer over the contacts of bad cells and by shorting across all cells and then removing the shorts across the good cells.

1 Claim, 3 Drawing Figures

INVENTOR.
ALVA I. ARCHER
BY Robert E. Walrath
ATTORNEY

DISCRETIONARY INTERCONNECTION PROCESS

The invention herein described was made in the course of or under Government contract N60530–C–68–0375 with the Naval Undersea Warfare Center.

BACKGROUND OF THE INVENTION

In producing integrated circuits the limiting factor on the number of components which can be produced on one chip or wafer is generally the yield of the individual components. If the yield is too low, it becomes economically unfeasible to produce a particular integrated circuit. Where it is desired to produce numerous circuits on one wafer, the yield may become so low that a wafer with all operable circuits on it will rarely be produced. Usually the wafer is cut into pieces or chips with one or only a few individual circuits on each chip. Then the chips with operable circuits are wired together in a system. This procedure is undesirable since the most unreliable part of such a system is the bonds and leads connecting the various chips together. Accordingly, it is highly desirable to be able to fabricate an entire system on one wafer.

Discretionary interconnection schemes for connecting only the good circuits on a wafer into a system have been proposed in the past, however, these schemes while very flexible generally require the use of a computer or very sophisticated devices and procedures to make the discretionary interconnections. This invention provides a process with which individual identical or similar circuits on a single wafer may be interconnected discretionarily to form a continuous chain of such circuits without the use of sophisticated or expensive equipment and techniques.

SUMMARY OF THE INVENTION

This invention is related to a discretionary interconnection technique or process wherein chains of similar or identical cells may be discretionarily connected so that the cells on one wafer may be connected into an operable system. On every wafer there will usually be several cells or circuits which are not operable for one reason or another. When the circuits on a wafer are connected in accordance with this invention, however, the inoperative or bad cells do not become a part of the final system. These cells are not connected into the system and are bridged by the conductors which interconnect the sound cells. While there are numerous variations of this invention, the essential feature is that defective or inoperative cells or units do not become a part of the final system.

As was noted above, various discretionary interconnection techniques have been proposed in the prior art. The major advantage of this invention over the prior art techniques is that when it is required to form long chains of cells this invention is much simpler to practice and does not require the sophisticated equipment that the prior art discretionary interconnection techniques require. Correspondingly, this invention is generally not usable where the cells on the wafer are dissimilar or there is no systematic connection of chains of cells because the interconnection problem becomes too complex.

To practice this invention, the cells are first fabricated on a wafer. The cells are then probed or tested to determine which cells are defective or inoperative. The cells are covered by a dielectric layer, a second layer connection pattern is formed, and connections are made to contacts on the good cells only with the connection pattern skipping across defective cells. Defective or inoperative cells may be bridged by first bridging all cells and then remove the bridges between the input and the output of the good cells.

Accordingly, it is an object of this invention to provide a simple and inexpensive means for interconnecting chains of similar or identical units or cells discretionarily.

This object and other objects and advantages of this invention will become evident to those skilled in the art upon a reading of this specification and the appending claims in conjunction with the drawings.

DETAILED DESCRIPTION OF THE INVENTION

Figures 1, 2, 3:
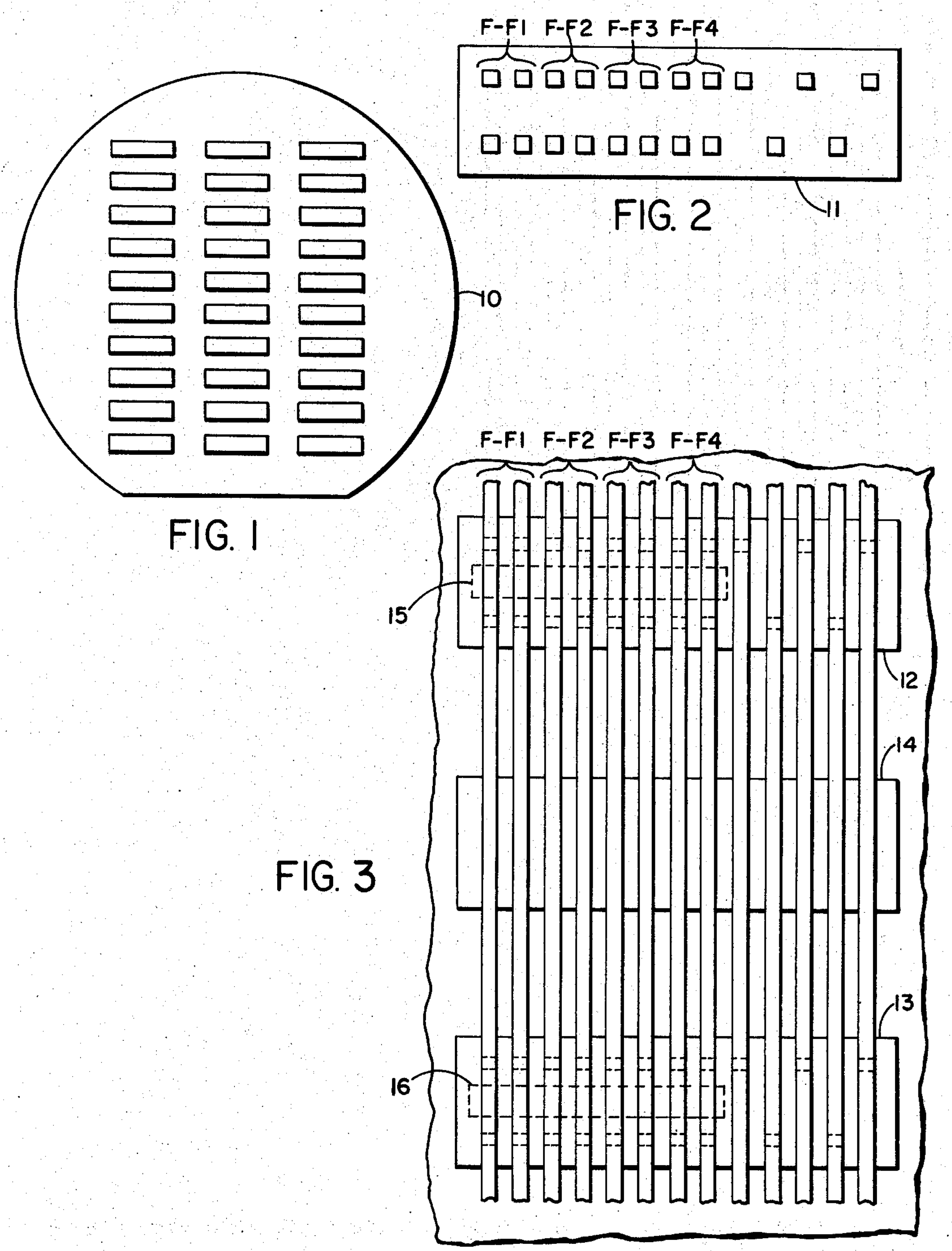
FIG. 1 is a drawing of a wafer with a plurality of cells indicated schematically.
FIG. 2 is a schematic representation of one cell showing an example of contact arrangement.
FIG. 3 is a schematic representation of three cells with an interconnection pattern over the cells with all of the inputs of each cell shorted to corresponding outputs.

FIG. 1 shows a substrate or wafer 10 with a plurality of units or cells placed thereon. Each of the cells may contain any desired integrated circuit structure. Generally, each of the cells is isolated electrically from every other cell. The cells may be a very simple or elemental integrated circuit or may be complex subsystems. In general, this invention may be used to connect any type of cell where it is desired to connect similar or identical cells into chains.

An example of the contact placement of a cell is shown in FIG. 2. Cell 11 of FIG. 2 corresponds to one of the cells shown on wafer 10 in FIG. 1. The cells may be placed on wafer 10 by any process known in the art. In one practical application of this invention, it was desired to fabricate a system which would generate the cross-correlation function of two digital data streams. The system contained a shift register and various other circuitry to form the cross-correlation function. The circuitry was basically a set of uniform or similar units connected in a chain. Cell 11 of FIG. 2 is an illustration of the contact placement for one of the cells in this system. The squares on cell 11 represent the contacts to be made to the cell. The cell contained four flip-flops and five additional contacts through which ground leads and other leads could be applied for such purposes as setting or clearing the cell. The circuitry that comprised the cell and the process used to fabricate the cell will not be described in detail since the particular fabrication process and circuit structure is not essential to this inventive concept.

The first step in practicing this invention is to fabricate the structure shown in FIG. 1. In fabricating a cell, it is necessary to interconnect the components which comprise the cell. These interconnections can be made in a first layer of interconnections to connect the components together. This layer of interconnections would be the same for each of the cells. The contact pads (such as those shown in FIG. 2) are deposited during this step. Some interconnections between cells can also be made in the first layer of interconnections.

The next step is to test each of the circuits to determine which circuits are operative or good and which are inoperative or bad. The testing may be done with the use of standard probing techniques. The positions of the good and bad cells are recorded.

The next step in the process is to cover the wafer with a layer of etchable dielectric. Typically, an oxide of the semiconductor material may be used as the etchable dielectric.

The next step is to apply a positive photoresist to the wafer and to make a contact mask with transparent areas in the mask corresponding to the contacts shown in FIG. 2. This mask is stepped across the wafer and positioned over each of the good or sound cells. An exposure is made over each of the sound cells to expose the photoresist. Next, the photoresist is developed and the dielectric is etched so that contact apertures or holes will be made through the dielectric layer over each of the contact pads of the good cells. Alternatively, a mask corresponding to the contacts shown in FIG. 2 may be stepped relative to a photographic plate, exposing the plate in a discretionary manner to generate a composite contact mask which can be used to expose the photoresist (positive or negative) in all the desired locations in a single exposure.

The next step is to apply a second layer of metal interconnections such as those shown in FIG. 3. In FIG. 3, assume that cell 12 and cell 13 are good cells and that cell 14 is defective. Since cell 14 is defective no contact apertures are made through the dielectric over cell 14. Contact apertures are made through the dielectric over cells 12 and 13. These contact apertures are shown in dashed lines under the conductors in FIG. 3. Note that the interconnection pattern connects the inputs and outputs of each of the flip-flops of each of the cells together. For example, the inputs of the first flip-flop of cell 12 are connected to the outputs of the same flip-flop, and so forth. These shorts between the inputs and outputs of the flip-flops must be removed in the next step.

The next step is to again apply a positive photoresist to the wafer. A mask is then generated with a single slot. This mask is stepped over the good cells and the photoresist is exposed. The area of the photoresist exposed is shown in cell 12 by dashed lines 15 and in cell 13 by dashed lines 16. The metal conductors underlying the exposed photoresist are etched after the photoresist is developed so that the shorts are removed. When the shorts are removed, the chain of flip-flops is formed. Alternatively the mask bearing a single slot may be stepped relative to a photographic plate, exposing the plate in a discretionary manner to generate a composite metal removal mask which can be used to expose the photoresist (positive or negative) in all the desired locations with a single exposure. In the specific example referred to above, this chain together with the appropriate interconnections in the first layer of metalization and the appropriate other circuitry provides a system for generating the cross-correlation function of two digital data streams.

Since the number of defective cells cannot be accurately predicted, the number of cells placed on the wafer may be more than necessary for the particular system. The extra cells can be treated as if they were defective so that the resulting system contains the proper number of cells.

While I have shown and described my invention with reference to specific structure, it is clear that the inventive concept is broader than any specific structure shown. For example, my invention can be used to fabricate various circuits or systems such as shift registers, counters, certain types of gating arrays, integrated memories, etc. Furthermore, those skilled in the art will realize that many modifications and variations can be made without the spirit and scope of my invention. Accordingly, I do not wish to be limited to any specific details illustrated in the drawings or described in the specification, but only by the scope of the appended claims.

I claim:

1. A process for making connections to integrated circuits on a common semiconductor substrate including the steps of:

fabricating an array of substantially identical integrated circuits on a common semiconductor substrate;

testing each of said circuits for defects;

depositing a dielectric material over the array of circuits;

etching apertures in the dielectric in the areas over the inputs and outputs of all the circuits;

depositing a pattern of generally parallel conductors over said apertures to connect, in continuous columnar chains, all inputs and outputs of adjacent circuits; and removing segments of the conductor between the inputs and outputs of the non-defective circuits, but leaving the inputs and outputs of the defective units shorted.

* * * * *